United States Patent
Li

(10) Patent No.: US 10,818,855 B2
(45) Date of Patent: Oct. 27, 2020

(54) METHOD OF MANUFACTURING AN ORGANIC LIGHT EMITTING DIODE DISPLAY

(71) Applicant: Wuhan China Star Optoelectronics Semiconductor Display Technology Co., Ltd., Wuhan (CN)

(72) Inventor: Wu Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 138 days.

(21) Appl. No.: 16/326,373

(22) PCT Filed: Sep. 27, 2018

(86) PCT No.: PCT/CN2018/107917
§ 371 (c)(1),
(2) Date: Feb. 19, 2019

(87) PCT Pub. No.: WO2020/037778
PCT Pub. Date: Feb. 27, 2020

(65) Prior Publication Data
US 2020/0136065 A1    Apr. 30, 2020

(30) Foreign Application Priority Data
Aug. 20, 2018    (CN) .......................... 2018 1 0947941

(51) Int. Cl.
| H01L 51/50 | (2006.01) |
| H01L 51/00 | (2006.01) |
| B32B 37/12 | (2006.01) |
| B32B 43/00 | (2006.01) |
| H01L 27/32 | (2006.01) |
| H01L 51/52 | (2006.01) |
| H01L 51/56 | (2006.01) |

(52) U.S. Cl.
CPC .......... *H01L 51/0097* (2013.01); *B32B 37/12* (2013.01); *B32B 43/006* (2013.01); *H01L 27/3244* (2013.01); *H01L 51/003* (2013.01); *H01L 51/5253* (2013.01); *H01L 51/56* (2013.01); *B32B 2457/206* (2013.01); *H01L 2227/323* (2013.01); *H01L 2227/326* (2013.01); *H01L 2251/5338* (2013.01); *H01L 2251/556* (2013.01)

(58) Field of Classification Search
USPC ...... 257/13, 79–103, 918, 40, 642–643, 759
See application file for complete search history.

(56) References Cited

U.S. PATENT DOCUMENTS

| 2010/0243140 | A1 | 9/2010 | Sloan |
| 2018/0076400 | A1* | 3/2018 | Jung ..................... B32B 17/064 |

FOREIGN PATENT DOCUMENTS

| CN | 205356800 | 6/2016 |
| CN | 107819072 | 3/2018 |

* cited by examiner

*Primary Examiner* — Moin M Rahman

(57) ABSTRACT

A method of manufacturing an organic light emitting diode display is provided. The method includes: pasting a backboard to an underside of the flexible substrate by a viscosity-variable adhesive; severing the backboard located in the bended region from the backboard located in the non-bended region; peeling off the backboard located in the bended region; and performing a viscosity enhancement treatment to the viscosity-variable adhesive on the non-bended region.

17 Claims, 3 Drawing Sheets

METHOD OF MANUFACTURING AN ORGANIC LIGHT EMITTING DIODE DISPLAY

RELATED APPLICATIONS

This application is a National Phase of PCT Patent Application No. PCT/CN2018/107917 having International filing date of Sep. 27, 2018, which claims the benefit of priority of Chinese Patent Application No. 201810947941.4 filed on Aug. 20, 2018. The contents of the above applications are all incorporated by reference as if fully set forth herein in their entirety.

FIELD AND BACKGROUND OF INVENTION

The present invention relates to the field of display technologies, and in particular, to a method for manufacturing an organic light emitting diode display.

Existing organic light emitting diode display includes an organic light emitting display layer distributed on a flexible substrate. In the specific manufacturing process, after the encapsulation layer is formed over the organic light emitting display layer, it is necessary to paste a backboard having certain hardness to an underside of the flexible substrate. Since the flexible substrate is very vulnerable, the flexible substrate is protected by the backboard in subsequent processes.

In order to achieve a narrow frame, a non-display area of the organic light emitting diode display is usually bent to the backside of the display area, and the backboard with certain hardness is difficult to bend during the bending process, so the backboard needs to be severed in the bended area.

In the specific manufacturing process, two sections of a backboard are pasted, and the first section of the backboard and the second section of the backboard are spaced apart beside the bended region. However, for an organic light emitting diode display with a very narrow frame (or no frame), since the bending radius is small (less than 0.3 mm), the gap between the two-sections of the backboard should be reduced correspondingly (for example, the gap width corresponding to the bending radius of 0.3 mm is about 0.94 mm.), and it can be seen that the pasting accuracy of the backboard is relatively high. However, the accuracy of the existing bonding equipment cannot meet the requirements of such accuracy of pasting. For example, the pasting accuracy of the backboard is less than 0.03 mm, but the accuracy of the existing bonding equipment is above 0.05 mm, so the process requirements cannot be met.

Therefore, it is necessary to provide a method of manufacturing an organic light emitting diode display to solve the problems of the prior art.

SUMMARY OF THE INVENTION

The object of the present invention is to provide a method of manufacturing an organic light emitting diode display that can prevent damage to a flexible substrate and improve product yield.

In order to solve the technical problems described above, the present invention provides a method of manufacturing an organic light emitting diode display, wherein the method includes: sequentially forming a switch array layer, an organic light emitting display layer, and an encapsulation layer on a flexible substrate of a non-bended region, and the method further includes:

pasting a backboard to an underside of the flexible substrate by a viscosity-variable adhesive, wherein the organic light emitting diode display includes a bended region and the non-bended region;

severing the backboard located in the bended region from the backboard located in the non-bended region;

peeling off the backboard located in the bended region; and performing a viscosity enhancement treatment to the viscosity-variable adhesive on the non-bended region of the backboard to enhance the viscosity of the viscosity-variable adhesive;

wherein the viscosity-variable adhesive includes a heat-stable adhesive or a photosensitive adhesive; and the viscosity-variable adhesive has a thickness ranging from 1 μm to 50 μm.

In the method of manufacturing an organic light emitting diode display of the present invention, wherein the step of performing a viscosity enhancement treatment to the viscosity-variable adhesive in the non-bended region of the backboard includes:

when the viscosity-variable adhesive is a heat-stable adhesive, heating the backboard located in the non-bended region; and when the viscosity-variable adhesive is a photosensitive adhesive, irradiating the backboard in the non-bended region with ultraviolet rays to perform a viscosity enhancement treatment to the viscosity-variable adhesive in the non-bended region of the backboard.

In the method of manufacturing an organic light emitting diode display of the present invention, wherein the heat-stable adhesive before heating and the photosensitive adhesive before ultraviolet irradiation both have a first adhesive force, and the heat-stable adhesive after heating and the photosensitive adhesive after ultraviolet irradiation both have a second adhesive force, and wherein the second adhesive force is greater than the first adhesive force.

In the method of manufacturing an organic light emitting diode display of the present invention, wherein the first adhesive force ranges from 3 to 30 g/inch, and the second adhesive force ranges from 500 to 3000 g/inch.

In the method of manufacturing an organic light emitting diode display of the present invention, wherein the heat-stable adhesive is heated at a temperature ranging from 45° C. to 120° C.

In the method of manufacturing an organic light emitting diode display of the present invention, wherein the heat-stable adhesive is heated at a temperature ranging from 45° C. to 60° C.

In the method of manufacturing an organic light emitting diode display of the present invention, wherein the photosensitive adhesive has an ultraviolet capability of greater than or equal to 300 mj/cm2.

In the method of manufacturing an organic light emitting diode display of the present invention, wherein the step of severing the backboard located in the bended region from the backboard located in the non-bended region includes:

severing the backboard located in the bended region from the backboard located in the non-bended region by laser.

In the method of manufacturing an organic light emitting diode display of the present invention, wherein the backboard has a thickness ranging from 25 μm to 250 μm.

In order to solve the technical problems described above, the present invention provides a method of manufacturing an organic light emitting diode display, wherein the method includes:

sequentially forming a switch array layer, an organic light emitting display layer, and an encapsulation layer on a flexible substrate of a non-bended region, and the method further includes:

pasting a backboard to an underside of the flexible substrate by a viscosity-variable adhesive; wherein the organic light emitting diode display includes a bended region and the non-bended region;

severing the backboard located in the bended region from the backboard located in the non-bended region;

peeling off the backboard located in the bended region; and performing a viscosity enhancement treatment to the viscosity-variable adhesive on the non-bended region of the backboard to enhance the viscosity of the viscosity-variable adhesive.

In the method of manufacturing an organic light emitting diode display of the present invention, wherein the viscosity-variable adhesive includes a heat-stable adhesive or a photosensitive adhesive.

In the method of manufacturing an organic light emitting diode display of the present invention, wherein the step of performing a viscosity enhancement treatment to the viscosity-variable adhesive in the non-bended region of the backboard includes:

when the viscosity-variable adhesive is a heat-stable adhesive, heating the backing plate located in the non-bended region; and when the viscosity-variable adhesive is a photosensitive adhesive, irradiating the backboard in the non-bended region with ultraviolet rays to perform a viscosity enhancement treatment to the viscosity-variable adhesive in the non-bended region of the backboard.

In the method of manufacturing an organic light emitting diode display of the present invention, wherein the heat-stable adhesive before heating and the photosensitive adhesive before ultraviolet irradiation both have a first adhesive force, and the heat-stable adhesive after heating and the photosensitive adhesive after ultraviolet irradiation both have a second adhesive force, and wherein the second adhesive force is greater than the first adhesive force.

In the method of manufacturing an organic light emitting diode display of the present invention, wherein the first adhesive force ranges from 3 to 30 g/inch, and the second adhesive force ranges from 500 to 3000 g/inch.

In the method of manufacturing an organic light emitting diode display of the present invention, wherein the heat-stable adhesive is heated at a temperature ranging from 45° C. to 120° C.

In the method of manufacturing an organic light emitting diode display of the present invention, wherein the heat-stable adhesive is heated at a temperature ranging from 45° C. to 60° C.

In the method of manufacturing an organic light emitting diode display of the present invention, wherein the photosensitive adhesive has an ultraviolet capability of greater than or equal to 300 mj/cm2.

In the method of manufacturing an organic light emitting diode display of the present invention, wherein the viscosity-variable adhesive has a thickness ranging from 1 μm to 50 μm.

In the method of manufacturing an organic light emitting diode display of the present invention, wherein the step of severing the backboard located in the bended region from the backboard located in the non-bended region includes:

severing the backboard located in the bended region from the backboard located in the non-bended region by laser.

In the method of manufacturing an organic light emitting diode display of the present invention, wherein the backboard has a thickness ranging from 25 μm to 250 μm.

In the method of manufacturing an organic light emitting diode display of the present invention, the backboard of the bended region is removed before performing the viscosity enhancement treatment, when the viscosity between the backboard and the flexible substrate is small, so that the backboard can be easily removed to prevent damage to the flexible substrate. Secondly, when there is a poor fit between the backboard and the flexible substrate, rework can be facilitated and the product yield can be improved. In addition, after the viscosity enhancement treatment is performed on the backboard from which the bended portion is removed, the adhesive force between the backboard and the flexible substrate gets larger, so that the flexible substrate can be better protected.

DESCRIPTION OF SPECIFIC EMBODIMENTS OF THE INVENTION

Figure 1:
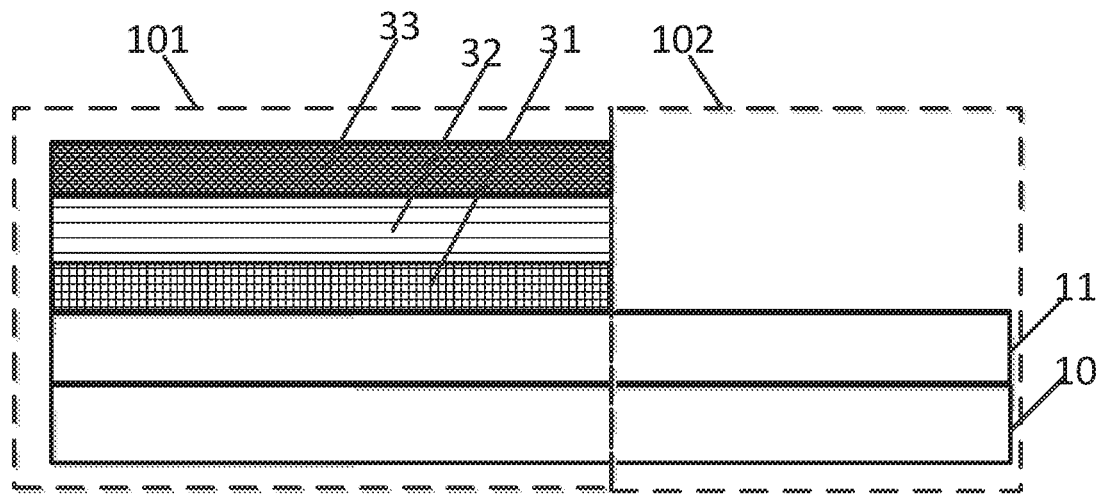
FIG. 1 is a structure diagram of a first step and a second step of a method for manufacturing an organic light emitting diode display of the present invention.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

Referring to FIG. 1 to FIG. 6, FIG. 1 is a structure diagram of a first step and a second step of a method for manufacturing an organic light emitting diode display of the present invention.

As shown in FIG. 1, the organic light emitting diode display of the present invention includes a non-bended region 101 and a bended region 102. The non-bended region 101 includes a display area. The manufacturing method mainly includes the following steps:

S101, forming a flexible substrate on a glass substrate.

For example, as shown in FIG. 1, a flexible material is deposited on a glass substrate 10 to form a flexible substrate 11. A peeling layer (not shown) can also be disposed between the glass substrate 10 and the flexible substrate 11.

S102, sequentially forming a switch array layer, an organic light emitting display layer, and an encapsulation layer on the flexible substrate in the non-bended region.

For example, a switch array layer 31, an organic light-emitting display layer 32, and an encapsulation layer 33 are sequentially formed on the flexible substrate 11. The switch array layer 31, the organic light emitting display layer 32, and the encapsulation layer 33 are located in the non-bended region 101 of the flexible substrate 11, specifically at the display area of the flexible substrate 11. The switch array layer 31 includes a plurality of thin film transistors; the organic light emitting display layer 32 includes an anode, an organic light emitting layer, and a cathode.

S103, peeling the flexible substrate off the glass substrate.

Figure 2:
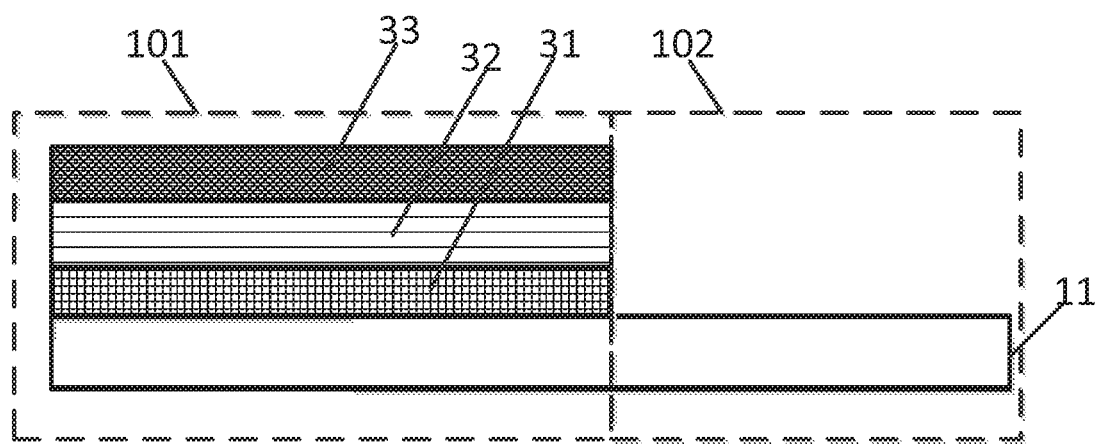
FIG. 2 is a structure diagram of a third step of the method for manufacturing an organic light emitting diode display of the present invention.

For example, in conjunction with FIG. 1 and FIG. 2, a peeling layer between the flexible substrate 11 and the glass substrate 10 is torn away to separate the flexible substrate 11 from the glass substrate 10.

S104, pasting a backboard to an underside of the flexible substrate by a viscosity-variable adhesive.

Figure 3:
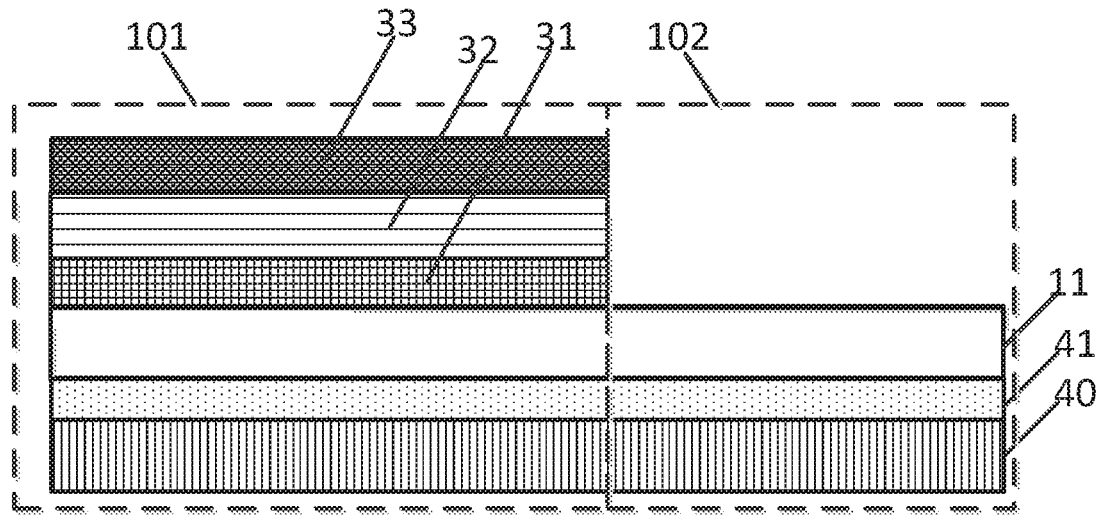
FIG. 3 is a structure diagram of a fourth step of the method for manufacturing an organic light emitting diode display of the present invention.

As shown in FIG. 3, a backboard 40 is pasted to an underside of the flexible substrate 11 by a viscosity-variable adhesive 41. The material of the backboard 40 includes PET (polyethylene terephthalate) and PE (polyethylene). In order to improve the protective effect, a thickness of the backboard 40 ranges from 25 μm to 250 μm.

In one embodiment, the viscosity-variable adhesive 41 includes a heat-stable adhesive or a photosensitive adhesive. The heat-stable adhesive before heating and the photosensitive adhesive before ultraviolet irradiation both have a first adhesive force. In order to prevent damage to the flexible substrate, the first adhesive force ranges from 3 to 30 g/inch, and the heating temperature of the heat-stable adhesive ranges from 45° C. to 120° C., preferably from 45 to 60° C. The photosensitive adhesive has an ultraviolet capability of greater than or equal to 300 mj/cm$^2$.

In order to improve the adhesive effect, the viscosity-variable adhesive 41 has a thickness ranging from 1 μm to 50 μm.

S105, severing the backboard located in the bended region from the backboard located in the non-bended region.

Figure 4:
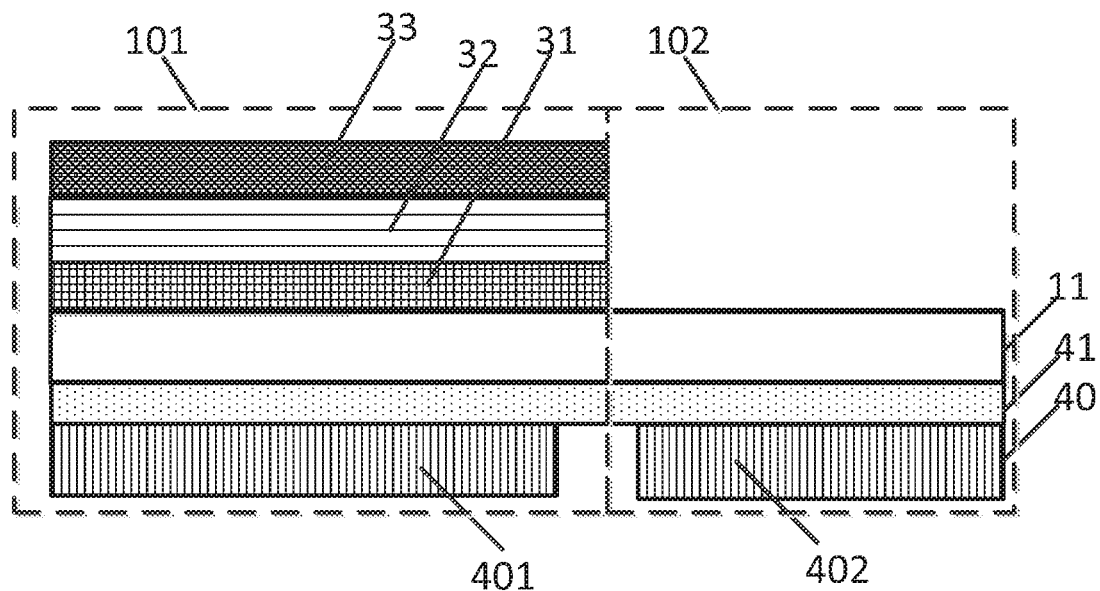
FIG. 4 is a structure diagram of a fifth step of the method for manufacturing an organic light emitting diode display of the present invention.

For example, as shown in FIG. 4, the backboard 40 located in the bended region 102 is separated from the backboard 40 located in the non-bended region 101. In an embodiment, the backboard located in the bended region 102 is separated from the backboard located in the non-bended region 101 by laser. The backboard 40 is formed with a first portion 401 and a second portion 402 that are spaced apart.

S106, peeling off the backboard located in the bended region.

Figure 5:
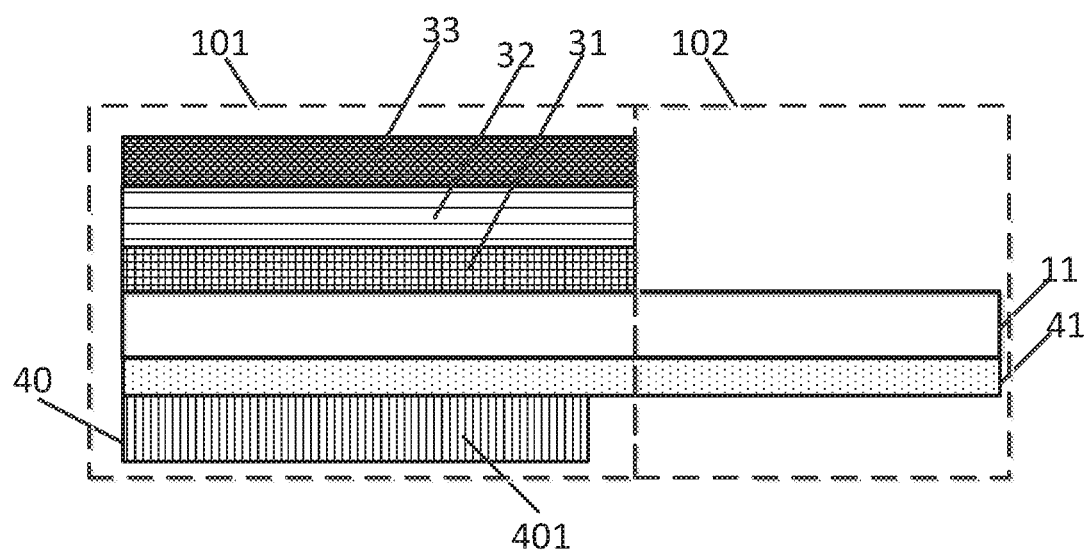
FIG. 5 is a structure diagram of a sixth step of the method for manufacturing an organic light emitting diode display of the present invention.

For example, as shown in FIG. 5, the backboard 40 located in the bended region 102 is peeled off; that is, the second portion 402 is peeled off.

S106, performing a viscosity enhancement treatment to the viscosity-variable adhesive on the non-bended region of the backboard to enhance the viscosity of the viscosity-variable adhesive.

In an embodiment, step S107, that is, the step of performing a viscosity enhancement treatment to the viscosity-variable adhesive on the non-bended region of the backboard includes:

S1071: performing heating or ultraviolet irradiation to the backboard located in the non-bended area to perform a viscosity enhancement treatment to the viscosity-variable adhesive on the non-bended region of the backboard.

For example, as shown in FIG. 5, when the viscosity-variable adhesive 41 is a heat-stable adhesive, heating the backboard 40 located in the non-bended region 101 (i.e. the first portion 401), wherein the heat-stable adhesive after heating has a second adhesive force.

When the viscosity-variable adhesive 41 is a photosensitive adhesive, irradiating the backboard 40 in the non-bended region 101 with ultraviolet rays, wherein the photosensitive adhesive after ultraviolet irradiation has the second adhesive force. The heat-stable adhesive before heating and the photosensitive adhesive before ultraviolet irradiation both have the first adhesive force. The second adhesive force is greater than the first adhesive force.

In order to enhance the adhesion between the backboard 40 of the non-bended region 101 and the flexible substrate 11, and to better protect the flexible substrate, the second adhesive force ranges from 500 to 3000 g/inch, preferably from 800 to 1200 g/inch.

Figure 6:
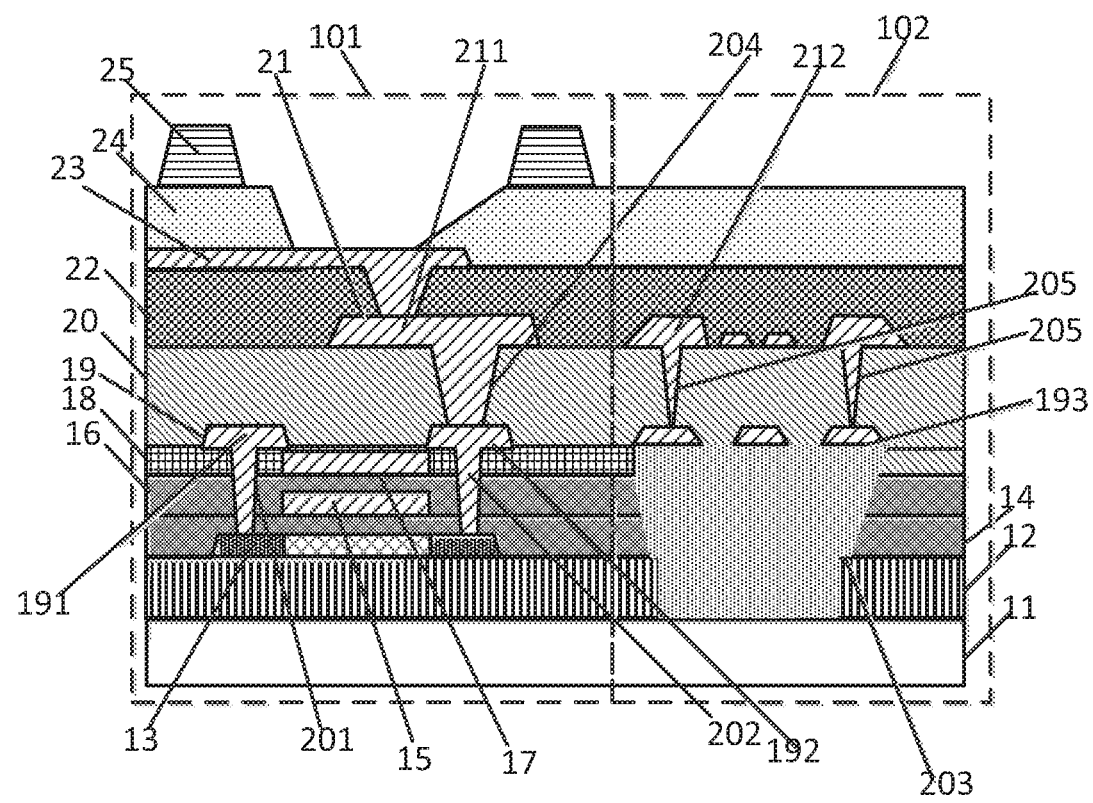
FIG. 6 is a structure diagram of an organic light emitting diode display of the present invention.

In an embodiment, the structure of the organic light emitting diode display is shown in FIG. 6. The manufacturing process of the organic light emitting diode display is as follows: sequentially forming a buffer layer 12, a semiconductor layer 13, a first gate insulating layer 14, a first gate electrode 15, a second gate insulating layer 16, a metal portion 17, and an interlayer insulating layer 18 on the flexible substrate 11.

The semiconductor layer 13 is patterned by a mask process to form a channel. A first metal layer is formed on the first gate insulating layer 14, and then the first metal layer is patterned by a mask to form the first gate electrode 15. A second metal layer is formed on the second gate insulating layer 16, and the second metal layer is patterned by a mask to form the metal portion 17.

The interlayer insulating layer 18 is patterned by a mask to form two first via holes 201, 202 and a second via hole 203, wherein the position of the first via hole 201 corresponds to the position of a source electrode; the position of the other first via hole 202 corresponds to the position of a first drain electrode.

A third metal layer 19 is formed on the interlayer insulating layer 18, and the third metal layer 19 is patterned by a mask process to form a source electrode 191 and a first drain electrode 192 and a plurality of first metal traces 193. The source electrode 191 and the first drain electrode 192 respectively correspond to the positions of the first via holes.

Thereafter, a first planarization layer 20 is formed on the third metal layer 19, and the first planarization layer 20 is patterned by a mask process to form a third via hole 204 and a fifth via hole 205.

A fourth metal layer 21 is formed on the first planarization layer 20, and the fourth metal layer 21 is patterned by a mask process to form a second drain electrode 211 and a plurality of third metal traces 212. The second drain electrode 211 is electrically connected to the first drain electrode 192 through the third via hole 204. A portion of the third metal trace 212 is connected to the corresponding first metal trace 193 through the fifth via hole 205.

A second flat layer 22 is formed on the fourth metal layer 21, and a sixth via hole (not shown) is formed on the second flat layer 22. The second flat layer 22 is formed with a conductive layer 23, and the conductive layer 23 is patterned by a mask process to form an anode. The anode is connected to the second drain electrode 211 through the sixth via hole.

A pixel defining layer 24 and a photoresist spacer layer are formed on the conductive layer 23, and the pixel defining layer 24 and the photoresist spacer layer are patterned by a mask process to form a preset patterned pixel defining layer and a photoresist spacer 25.

The next step includes forming an organic light-emitting layer and a cathode within the preset patterned pixel defining layer, and forming an encapsulation layer on the photoresist spacer 25, the cathode, and the pixel defining layer not covered by the photoresist spacer 25 and the cathode (not shown). It is to be understood that the specific structure of the organic light emitting diode display of the present invention is not limited to the structure shown in FIG. 6, and may be other structures, and details are not described herein again.

In the method of manufacturing an organic light emitting diode display of the present invention, the backboard of the bended region is removed before performing the viscosity enhancement treatment, when the viscosity between the backboard and the flexible substrate is small, so that the backboard can be easily removed to prevent damage to the flexible substrate. Secondly, when there is a poor fit between the backboard and the flexible substrate, rework can be facilitated and the product yield can be improved. In addition, after the viscosity enhancement treatment is performed on the backboard for which the bended portion is removed, the adhesive force between the backboard and the flexible substrate gets larger, so that the flexible substrate can be better protected.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A method of manufacturing an organic light emitting diode display, wherein the method comprises: sequentially forming a switch array layer, an organic light emitting display layer, and an encapsulation layer on a flexible substrate of a non-bended region, and the method further comprises: pasting a backboard to an underside of the flexible substrate by a viscosity-variable adhesive, wherein the organic light emitting diode display comprises a bonded region and the non-bended region; severing the backboard boated in the bonded region from the backboard boated in the non-bended region; peeling off the backboard located in the bonded region; and performing a viscosity enhancement treatment to the viscosity-variable adhesive on the non-bended region of the backboard to enhance the viscosity of the viscosity-variable adhesive; wherein the viscosity-variable adhesive comprises a heat-stable adhesive or a photosensitive adhesive; and the viscosity-variable adhesive has a thickness ranging from 1 μm to 50 μm, wherein the step of performing a viscosity enhancement treatment to the viscosity-variable adhesive in the non-bended region of the backboard comprises: when the viscosity-variable adhesive is a heat-stable adhesive, heating the backboard located in the non-bended region; and when the viscosity-variable adhesive is a photosensitive adhesive, irradiating the backboard in the non-bended region with ultraviolet rays to perform a viscosity enhancement treatment to the viscosity-variable adhesive in the non-bended region of the backboard.

2. The method of manufacturing an organic light emitting diode display according to claim 1, wherein the heat-stable adhesive before heating and the photosensitive adhesive before ultraviolet irradiation both have a first adhesive force, and the heat-stable adhesive after heating and the photosensitive adhesive after ultraviolet irradiation both have a second adhesive force, and wherein the second adhesive force is greater than the first adhesive force.

3. The method of manufacturing an organic light emitting diode display according to claim 2, wherein the first adhesive force ranges from 3 to 30 g/inch, and the second adhesive force ranges from 500 to 3000 g/inch.

4. The method of manufacturing an organic light emitting diode display according to claim 1, wherein the heat-stable adhesive is heated at a temperature ranging from 45° C. to 120° C.

5. The method of manufacturing an organic light emitting diode display according to claim 4, wherein the heat-stable adhesive is heated at a temperature ranging from 45° C. to 60° C.

6. The method of manufacturing an organic light emitting diode display according to claim 1, wherein the photosensitive adhesive has an ultraviolet capability of greater than or equal to 300 mj/cm2.

7. The method of manufacturing an organic light emitting diode display of claim 1, wherein the step of severing the backboard located in the bended region from the backboard located in the non-bended region comprises:
severing the backboard located in the bended region from the backboard located in the non-bended region by laser.

8. The method of manufacturing an organic light emitting diode display according to claim 1, wherein the backboard has a thickness ranging from 25 μm to 250 μm.

9. A method of manufacturing an organic light emitting diode display, wherein the method comprises: sequentially forming a switch array layer, an organic light emitting display layer, and an encapsulation layer on a flexible substrate of a non-bended region, and the method further comprises: pasting a backboard to an underside of the flexible substrate by a viscosity-variable adhesive; wherein the organic light emitting diode display comprises a bended region and the non-bended region; severing the backboard located in the bended region from the backboard located in the non-bended region; peeling off the backboard located in the bended region; and performing a viscosity enhancement treatment to the viscosity-variable adhesive on the non-bended region of the backboard to enhance the viscosity of the viscosity-variable adhesive, wherein the viscosity-variable adhesive comprises a heat-stable adhesive or a photo-sensitive adhesive, and wherein the step of performing a viscosity enhancement treatment to the viscosity-variable adhesive in the non-bended region of the backboard comprises: when the viscosity-variable adhesive is a heat-stable adhesive, heating the backing plate located in the non-bended region; and when the viscosity-variable adhesive is a photosensitive adhesive, irradiating the backboard in the non-bended region with ultraviolet rays to perform a viscosity enhancement treatment to the viscosity-variable adhesive in the non-bended region of the backboard.

10. The method of manufacturing an organic light emitting diode display according to claim 9, wherein the heat-stable adhesive before heating and the photosensitive adhesive before ultraviolet irradiation both have a first adhesive force, and the heat-stable adhesive after heating and the photosensitive adhesive after ultraviolet irradiation both have a second adhesive force, and wherein the second adhesive force is greater than the first adhesive force.

11. The method of manufacturing an organic light emitting diode display according to claim 10, wherein the first adhesive force ranges from 3 to 30 g/inch, and the second adhesive force ranges from 500 to 3000 g/inch.

12. The method of manufacturing an organic light emitting diode display according to claim 9, wherein the heat-stable adhesive is heated at a temperature ranging from 45° C. to 120° C.

13. The method of manufacturing an organic light emitting diode display according to claim 12, wherein the heat-stable adhesive is heated at a temperature ranging from 45° C. to 60° C.

14. The method of manufacturing an organic light emitting diode display according to claim 9, wherein the photosensitive adhesive has an ultraviolet capability of greater than or equal to 300 mj/cm2.

15. The method of manufacturing an organic light emitting diode display according to claim 9, wherein the viscosity-variable adhesive has a thickness ranging from 1 μm to 50 μm.

16. The method of manufacturing an organic light emitting diode display of claim 9, wherein the step of severing the backboard located in the bended region from the backboard located in the non-bended region comprises:
    severing the backboard located in the bended region from the backboard located in the non-bended region by laser.

17. The method of manufacturing an organic light emitting diode display according to claim 9, wherein the backboard has a thickness ranging from 25 μm to 250 μm.

* * * * *